(12) United States Patent
Van Winkle

(10) Patent No.: US 6,502,405 B1
(45) Date of Patent: Jan. 7, 2003

(54) FLUID HEAT EXCHANGER ASSEMBLY

(76) Inventor: John Van Winkle, 12120 McCoys Fork Rd., Walton, KY (US) 41094

( * ) Notice: Subject to any disclaimer, the term of this patent is extended or adjusted under 35 U.S.C. 154(b) by 0 days.

(21) Appl. No.: 10/079,052

(22) Filed: Feb. 19, 2002

Related U.S. Application Data

(60) Provisional application No. 60/340,987, filed on Oct. 30, 2001, and provisional application No. 60/344,501, filed on Oct. 19, 2001.

(51) Int. Cl.$^7$ ................................................. F25B 21/02
(52) U.S. Cl. ........................................ 62/3.61; 62/239
(58) Field of Search ........................... 62/3.2, 3.3, 3.61, 62/239, 244

(56) References Cited

U.S. PATENT DOCUMENTS

| | | | |
|---|---|---|---|
| 3,366,164 A | * 1/1968 | Newton | 165/50 |
| 3,874,183 A | * 4/1975 | Tabet | 123/196 AB |
| 4,945,977 A | 8/1990 | D'Agaro | |
| 5,154,661 A | * 10/1992 | Higgins | 62/3.2 |
| 5,367,879 A | 11/1994 | Doke et al. | |
| 5,441,576 A | * 8/1995 | Bierschenk et al. | 136/203 |
| 5,533,486 A | 7/1996 | Qutub | |
| 5,544,489 A | 8/1996 | Moren | |
| 5,558,069 A | 9/1996 | Stay | |
| 5,568,842 A | 10/1996 | Otani | |
| 5,590,532 A | * 1/1997 | Bachman | 62/3.3 |
| 5,711,155 A | * 1/1998 | DeVilbiss et al. | 62/3.3 |
| 5,964,206 A | 10/1999 | White et al. | |
| 5,970,719 A | 10/1999 | Merritt | |
| 5,988,265 A | 11/1999 | Marthaler | |
| 6,039,112 A | 3/2000 | Ruppel et al. | |
| 6,109,344 A | 8/2000 | Higgins | |
| 6,127,619 A | * 10/2000 | Xi et al. | 136/201 |
| 6,206,089 B1 | 3/2001 | Uchikawa et al. | |
| 6,236,810 B1 | 5/2001 | Kadotani | |
| 6,263,960 B1 | 7/2001 | Yamanaka et al. | |
| 6,270,015 B1 | * 8/2001 | Hirota | 237/12.3 B |

OTHER PUBLICATIONS

Cool It!, Internet site www.tropicool.com, first publication date unknown.
TE Technology, Internet site www.tetech.com, first publication date unknown.
Tellurex Prototype Kit and "The Cool World", Tellurex Corp., Internet site www.tellurex.com, copyright 2000.
Frequently Asked Qestions, Tellurex Corp., Internet site www.tellurex.com, copyright 2000.
Special Assembly Capabilities, Internet site www.melcor.com, first publication date unknown.

* cited by examiner

*Primary Examiner*—William E. Tapolcai
(74) *Attorney, Agent, or Firm*—Taft, Stettinius & Hollister LLP

(57) ABSTRACT

A vehicle system for transferring thermal energy in relation to a vehicle fluid includes at least one thermoelectric device, having at least two surfaces, concurrently dissipating thermal energy on a first surface and absorbing thermal energy on a second surface, mounted in proximity to a contained vehicle fluid so as to provide thermal communication between the contained vehicle fluid and either the cooler or the warmer surface of the thermoelectric device. Additionally, a method of cooling a vehicle fluid includes the steps of: (a) providing at least one thermoelectric device, having at least a first surface that changes temperature in a first direction upon activation of the thermoelectric device and a second surface opposing the first surface that changes temperature in an opposite direction upon activation of the thermoelectric device; (b) positioning the thermoelectric device such that the first surface is in thermal communication with a contained vehicle fluid; and (c) activating the thermoelectric device to develop a thermal gradient between the contained vehicle fluid and the first surface.

33 Claims, 11 Drawing Sheets

FLUID HEAT EXCHANGER ASSEMBLY

CROSS-REFERENCE TO RELATED APPLICATION

This application claims the benefit of U.S. Provisional Application Nos. 60/340,987, entitled "LUBRICANT HEATING AND COOLING SYSTEM", filed Oct. 30, 2001 and 60/344,501, entitled "KOOLFUEL FUEL COOLING SYSTEM", filed Oct. 19, 2001.

BACKGROUND

1. Field of the Invention

The present invention relates to vehicle fluid thermal energy exchanger systems and associated methods of use and manufacture. More particularly, the invention is related to vehicle liquid thermal energy exchanger systems, utilizing commercially available thermoelectric heat transfer devices that have the capability to concurrently provide heating and cooling on opposing sides of the device.

2. Description of the Related Art

The heating and/or cooling of liquid in transit or at a point of accumulation has been effectuated in a multitude of fashions dating back as far as the origin of the very reasons for such heat transfer. Older pieces of art typically center around heat transfer from or to a fluid by the circulation of currents from one region to another, or by the emission and propagation of energy in the form of rays or waves.

More specifically, in the area of internal combustion engines, it is well known in the art that cooling the engine below the temperature at which thermal breakdown of materials occurs is necessary. Various methods have been developed to cool the engine from forced air convection to the more common form of convection where a liquid is pumped around or through the engine to draw thermal energy off the engine as a result of combustion. However, little attention has been paid to the cooling of combustion fuels before these fuels enter the combustion chamber. U.S. Pat. No. 5,887,555 issued to Schmitz, discloses a fuel cooling device for marine application. The invention discloses a housing in which the fuel pump is contained in and utilizes water as the cooling agent. The water circulating in the housing is operative to cool the fuel pump and fuel therein.

Alternatively, fuels such as diesel, are optimally heated before entry into the combustion chamber. This heating ensures less activation energy is required for the fuel to combust. Additionally, fuels such as diesel will become gelatinous at lower temperatures, thereby hindering the transfer from the fuel tank to the combustion chamber. Traditionally, the solution to the aforementioned problem has been to utilize fuel additives which retard the increase in viscosity as the temperature decreases.

Cooling lubricants is also well known within the prior art. Various methods have been developed which utilize fluid currents (air and coolant fluid) to draw thermal energy away from a lubricant. These methods include the use of devices known as heat sinks, which typically are designed for absorbing or dissipating thermal energy by having a large surface area to volume ratio. Some heat sinks employ electromechanical devices that produce fluid currents thereby increasing the potential for thermal energy transfer by decreasing the boundary layer between the heat sink and fluid.

The most common version of a thermal energy transfer device is a vehicle radiator. The radiator contains fluid within channels providing thermal communication between the engine and the fluid, such that the radiator fluid carries away thermal energy from the engine. The radiator fluid is thereafter cooled by passing through conduits having a high degree of surface area which enable fluids passing over the conduits to carry away a portion of the thermal energy of the radiator fluid. Alternatively, engine block heaters have been developed which heat radiator fluid. The most common versions of these devices are powered by AC current and utilize electrical resistance to current flow to produce thermal energy which is transferred to the radiator fluid. One version, utilizes a thermal energy measuring device which controls power to a heating element and a pump which circulates the radiator fluid, while another device strictly utilizes a heater which takes advantage of thermal gradients within the radiator fluid itself to provide thermal energy to the fluid.

SUMMARY OF THE INVENTION

The present invention relates to vehicle fluid thermal energy exchanger systems and associated methods of use and manufacture. More particularly, the invention is related to vehicle liquid thermal energy exchanger systems. The invention may utilize one or more thermoelectric devices manufactured from two ceramic wafers and a series of "P & N" doped semiconductor blocks sandwiched therebetween. The ceramic wafered thermoelectric devices provide concurrent thermal energy absorption and dissipation on the opposing wafers. The thermoelectric devices take advantage of the Peltier effect; a phenomenon which occurs whenever electrical current flows through two dissimilar conductors. Depending upon the flow of the current, the junction of the two conductors will either absorb or dissipate thermal energy. The thermal energy is moved by the charge carriers in the direction of current flow throughout the circuit.

The invention utilizes this movement of thermal energy within the thermoelectric device to create thermal gradients between the target and a corresponding wafer surface. If the target is a fluid, such as water to be cooled, the temperature of the water and the temperature of the cooler surface of the wafer are the points of reference for determining the thermal energy gradient. So long as the mean temperature of the cooler surface is less than that of the target, thermal energy will be drawn from the target and absorbed by the cooler surface, thereby cooling the target. In some applications in which the target is a fluid, it may not be desired that the thermoelectric device come into direct contact with the target; only thermal communication is necessary for thermal energy transfer. As such, the fluid targets may be contained in a reservoir or a conduit. In these examples, the thermoelectric device will not necessarily be in direct contact with the fluid, but may be positioned such that thermal energy may be exchanged between the target and at least one surface of the thermoelectric device.

In particular, the thermoelectric devices may be positioned in such a manner so as to cool or heat vehicle fluids. In an illustrative example, vehicle fuel coming from a fuel source may be cooled by the present invention before being combusted. Alternatively, the fuel may pass within thermal communication of the warmer surface and thereby be heated before being combusted. In these examples, thermal communication allows for the exchange of thermal energy between the target and at least one surface of the thermoelectric device. In an exemplary embodiment, the cooler surface is in thermal communication with a heat transfer material, which is subsequently in thermal communication with the target vehicle fluid. The process of thermal energy transfer from a contained target to the warmer surface in a cooling operation includes: thermal energy leaving the target fluid and being absorbed by the heat transfer material; thermal energy leaving the heat transfer material and being absorbed by the cooler surface of the thermoelectric device; and, thermal energy being moved or pumped, from the cooler surface along with thermal energy produced from the resistance to current flow, to the warmer surface of the thermoelectric device.

Advantageously, the ceramic wafered thermoelectric devices operate on relatively low power and voltages and are relatively durable. Because the ceramic wafered thermoelectric devices dissipate heat on the side (warming side) of the device opposite that of the cooling side (absorbing heat), the above describedexemplary embodiment of the invention may utilize a heat sink to improve dissipation of such excess thermal energy from the warming side.

It is a first aspect of the present invention to provide a vehicle system for transferring thermal energy in relation to a vehicle fluid comprising: at least one thermoelectric device, having at least two surfaces, concurrently dissipating thermal energy on a first surface and absorbing thermal energy on a second surface, mounted in proximity to a contained vehicle fluid, and providing thermal communication between the contained vehicle fluid and at least one of the first and second surfaces of the thermoelectric device.

It is a second aspect of the present invention to provide a method of cooling a vehicle fluid that includes the steps of: (a) providing at least one thermoelectric device, having at least a first surface that changes temperature in a first direction upon activation of the thermoelectric device and a second surface opposing the first surface that changes temperature in an opposite direction upon activation of the thermoelectric device; (b) positioning the thermoelectric device such that the first surface is in thermal communication with a contained vehicle fluid; and (c) activating the thermoelectric device to develop a thermal gradient between the contained vehicle fluid and the first surface.

It is a third aspect of the present invention to provide a method of retrofitting a vehicle with a vehicle fluid cooling system including: (a) mounting a vehicle cooling system for transferring thermal energy in relation to a closed vehicle fluid system, where the vehicle cooling system includes at least one thermoelectric device with at least two surfaces, a first and second surface acting concurrently where the first surface absorbs thermal energy and the second surface dissipates thermal energy; and (b) configuring the thermoelectric device to receive power from at least one power source.

It is a fourth aspect of the present invention to provide a vehicle fuel cooling system including: (a) a heat sink; (b) a first heat transfer material block having a fuel conduit extending therethrough; and (b) at least one ceramic wafered thermoelectric device, having a cooling wafer and a heating wafer, positioned (or sandwiched) between the heat transfer material block and the heat sink in such a way that the heat transfer material block contacts the cooling wafer and the heat sink contacts the heating wafer.

It is a fifth aspect of the present invention to provide a method of cooling a vehicle fuel comprising the steps of: (a) providing at least one ceramic wafered thermoelectric device having at least a cooler and warmer ceramic surfaces opposing one another; and (b) utilizing the ceramic wafered thermoelectric device to develop a gradient between the vehicle fuel and the cooler ceramic surface of the ceramic wafered thermoelectric device.

It is a sixth aspect of the present invention to provide a vehicle fuel cooling system comprising: (a) first heat transfer material block having a fuel conduit extending therethrough; (b) a finned heat transfer material block; (c) at least one ceramic wafered thermoelectric device, having a cooling surface and a heating surface, sandwiched between the first heat transfer material block and the finned heat transfer material block in such a way that the first heat transfer material block contacts the cooling wafer surface and the finned heat transfer material block contacts the heating wafer surface; and (d) a power source supplying power to the ceramic wafered thermoelectric device.

It is a seventh aspect of the present invention to provide a vehicle fuel heating system comprising: (a) a heat sink; (b) a first heat transfer material block having a fuel conduit extending therethrough; and (c) at least one ceramic wafered thermoelectric device, having a cooling wafer and a heating wafer, sandwiched between the first heat transfer material block and At the heat sink in such a way that the first heat transfer material block contacts the heating wafer and the heat sink contacts the cooling wafer.

It is an eighth aspect of the present invention to provide a method of heating a vehicle fuel comprising the steps of: (a) providing at least one ceramic wafered thermoelectric having at least a cooler and warmer ceramic surfaces opposing one another; and (b) utilizing the ceramic wafered thermoelectric device to develop a gradient between a vehicle fuel and the warmer ceramic surface of the device.

It is a ninth aspect of the present invention to provide a vehicle fuel heating system comprising: (a) a first heat transfer material block having a fuel conduit extending therethrough; (b) a finned heat transfer material block; (c) at least one ceramic wafered thermoelectric device, having a cooling surface and a heating surface, sandwiched between the first heat transfer material block and the finned heat transfer material block in such a way that the first heat transfer material block faces the heating surface and the finned heat transfer material block faces the cooling wafer surface; and (d) a power source to supply electricity to the ceramic wafered thermoelectric device.

It is a tenth aspect of the present invention to provide a vehicle lubricant cooling system comprising: (a) a heat sink; (b) a first heat transfer material block having a heat transfer appendage extending into a vehicle lubricant accumulation vessel; and (c) at least one ceramic wafered thermoelectric device having a cooling and heating wafer, positioned between the heat sink and the first heat transfer material block and positioned in such a manner that the cooling wafer is in thermal communication with the first heat transfer material block and the heating wafer is in thermal communication with the heat sink.

It is an eleventh aspect of the present invention to provide a method of cooling vehicle lubricants comprising the steps of: (a) providing at least one ceramic wafered thermoelectric device having opposing cooler and warmer surfaces; and (b) utilizing the ceramic wafered thermoelectric device to develop a gradient between the vehicle lubricant and the cooler ceramic wafer surface of the thermoelectric device.

It is a twelfth aspect of the present invention to provide a vehicle lubricant cooling system comprising: (a) a vehicle lubricant accumulation vessel having a vehicle lubricant inlet and a vehicle lubricant outlet; (b) a first heat transfer material block having a heat transfer appendage extending into the lubricant accumulation vessel; (c) a heat sink; (d) at least one ceramic wafered thermoelectric device having a cooling and heating surface, sandwiched between the heat sink and the first heat transfer material block and positioned in such a manner that the cooling surface faces the first heat transfer material block and the warmer surface faces the heat sink; and (e) a power source to supply electricity to the ceramic wafered thermoelectric device.

It is a thirteenth aspect of the present invention to provide a vehicle lubricant heating system comprising: (a) a heat sink; (b) a first heat transfer material block having a heat transfer appendage extending therefrom and into a vehicle lubricant accumulation vessel; and (c) at least one ceramic wafered thermoelectric device having a cooler wafer and a heating wafer, sandwiched between the first heat transfer material block and the heat sink such that the heating wafer contacts the first heat transfer material block and such that the cooling wafer contacts the heat sink.

It is a fourteenth aspect of the present invention to provide a method of heating a vehicle lubricant comprising the steps of: (a) providing at least one ceramic wafered thermoelectric device having at least a cooler ceramic surface and a warmer ceramic surface opposing the cooler ceramic surface; and (b) utilizing the ceramic wafered thermoelectric device to develop a gradient between a vehicle lubricant and the warmer ceramic surface of the ceramic wafered thermoelectric device.

It is a fifteenth aspect of the present invention to provide a vehicle lubricant heating system comprising: (a) a vehicle lubricant accumulation vessel having a vehicle lubricant inlet and a vehicle lubricant outlet; (b) a first heat transfer material block having a heat transfer appendage extending therefrom and into the vehicle lubricant accumulation vessel; (c) a heat sink; (d) at least one ceramic wafered thermoelectric device having a cooling surface and a heating surface, sandwiched between the first heat transfer material block and the heat sink such that the heating surface contacts the first heat transfer material block and such that the cooling surface contacts the heat sink; and (e) a power source operatively coupled to the ceramic wafered thermoelectric device.

It is a sixteenth aspect of the present invention to provide a method for pre-heating a vehicle lubricant including the steps of: (a) providing a vehicle lubricant vessel, installed onto a vehicle, for storing a vehicle lubricant; (b) extending an appendage of heat transfer material into the vehicle lubricant stored within the vehicle lubricant vessel; and (c) heating the appendage of heat transfer material by activating a ceramic wafered thermoelectric device having a cooling surface and an opposed heating surface, wherein the heating surface is operatively coupled to the appendage.

DETAILED DESCRIPTION OF THE PREFERRED EMBODIMENTS

The present invention provides a vehicle system and method for exchanging thermal energy between a vehicle fluid and a vehicle fluid thermal energy exchanger. The methods and systems described below are exemplary in nature and are not intended to constitute limits upon the present invention.

Figure 1:
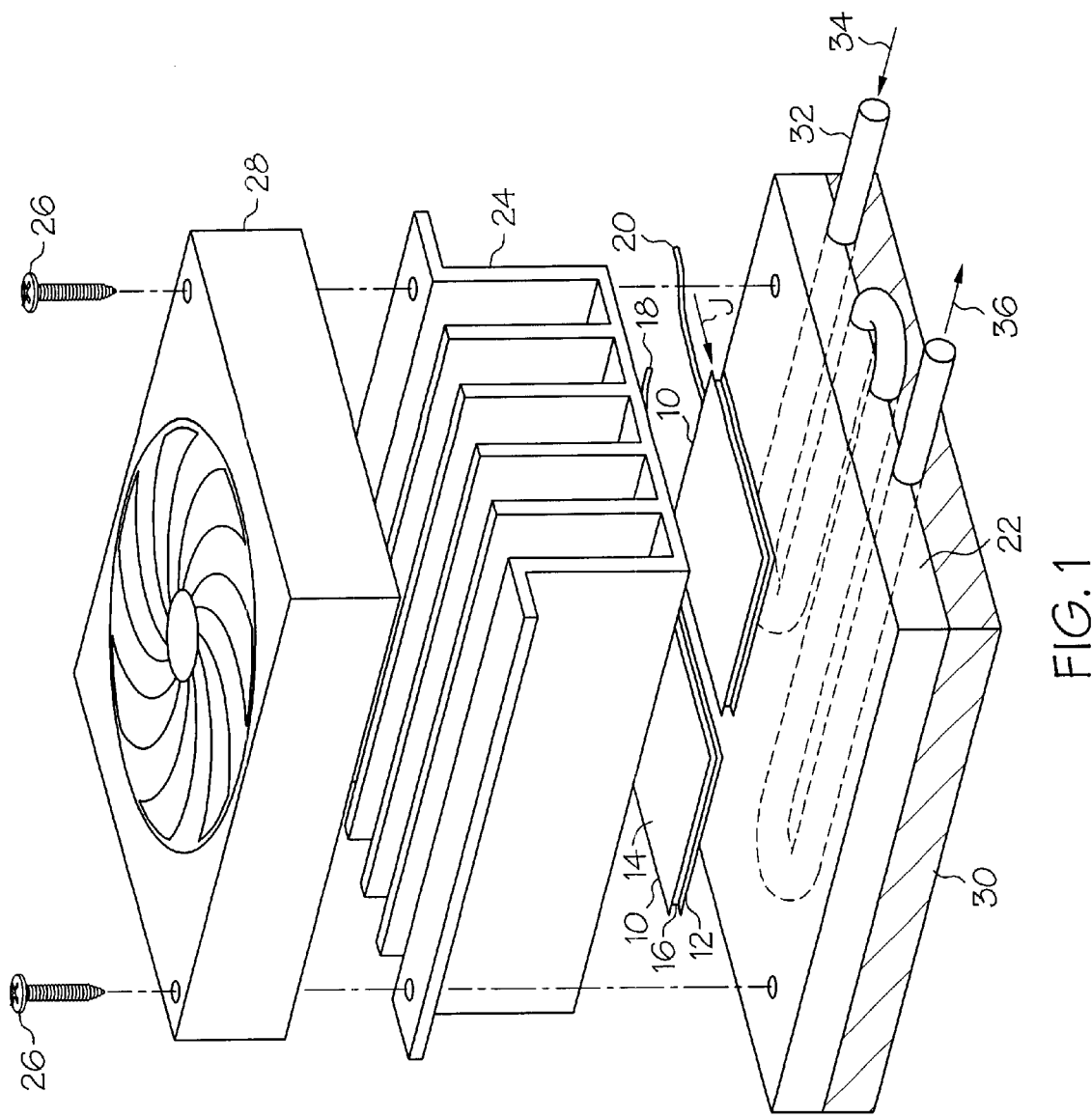
FIG. 1 is an exploded perspective view of a first exemplary embodiment of the present invention, a vehicle fuel cooling assembly.

The exemplary embodiments of the present invention utilize commercially-available ceramic wafered thermoelectric devices (CWTDs) that have opposed ceramic surfaces. Upon activation of the CWTD(s), one of the ceramic surfaces becomes heated while the opposing one of the ceramic surfaces becomes cooled. For example, as shown in FIG. 1, the ceramic wafered thermoelectric devices (CWTDs) 10, in the exemplary embodiments, utilize two thin ceramic wafers 12, 14 with a series of bismuth telluride semi-conductor blocks 16 sandwiched therebetween that are sufficiently doped to exhibit an excess of electrons (P) or a deficiency of electrons (N). The wafer material provides an electrically-insulated and mechanically rigid support structure for the thermoelectric device. The "P & N" type semiconductor blocks are electrically interconnected such that, upon electrical activation, and depending upon the polarity, heat is transferred from one ceramic wafer to the opposite wafer causing one ceramic wafer 12 to become cooled while the opposing ceramic wafer 14 becomes hot. The CWTD(s) 10 are commercially available, for example, as the ZMAX® line from Tellurex Corporation, Traverse City, Mich. (www.tellurex.com).

CWTD 10 has leads 18, 20 which provide direct current in the "J" direction to the device, thereby making one wafer 14 warmer in comparison to the other wafer 12 which is cooler. Upon switching of the leads 18, 20 and directing current in the opposite direction, "–J", the one wafer 14 now becomes the cooler wafer and the other wafer 12 becomes the warmer wafer. This flexibility enables the opposing wafers 12, 14 of the CWTD 10 to change their character (heating to cooling or cooling to heating) simply by changing the direction of direct current flow. However, the following exemplary embodiments will be explained using the wafer 12 as the cooler wafer, while the wafer 14 will be referred to as the warmer wafer.

Referencing FIG. 1, assembly of a first exemplary embodiment of a vehicle fluid thermal energy exchanger 11 begins by positioning the CWTD(s) 10 so as to be in thermal communication with a heat transfer material block 22 and a heat sink 24. The warmer wafer 14 is positioned to be in thermal communication with the heat sink 24, while the cooler wafer 12 is positioned to be in thermal communication with the heat transfer material block 22. In the exemplary embodiment, the warmer wafer 14 is adjacent to, and in contact with the heat sink 24 while the cooler wafer 12 is adjacent to, and in contact with the heat transfer material block 22. However, it is not necessary that any, or the entire surface of the warmer wafer 14 be in direct contact with the heat sink 24, nor that the cooler wafer 12 be in direct contact with the heat transfer material block 22, so long as thermal communication is preserved. The heat transfer material block 22 is thereafter mounted to the heat sink 24 with screws 26 in this exemplary embodiment; but any chemical or mechanical technique, without limitation, such as utilizing an epoxy resin, adhesive or compression fitting, is acceptable for mounting the heat sink 24 and heat transfer material block 22, so long as the technique allows thermal communication between the warmer wafer 14 and the heat sink 24, as well as thermal communication between the heat transfer material block 22 and the cooler wafer 12. Additionally, a fan 28 is mounted to the heat sink 24 which provides induced fluid currents over the heat sink 24 to thereby assist in the dissipation of thermal energy from the heat sink 24. The attached fan 28 is mounted to the heat sink 24 via screws 26 in this exemplary embodiment, however, any chemical or mechanical technique, without limitation, such as epoxy resin, adhesive or compression fittings are appropriate so long as the mounting is maintained.

Optionally, insulation 30 may be utilized to insulate the exposed portions of the semiconductor blocks 16 as well as portions of heat transfer material block 22. The insulation 30 may be any type of insulation which withstands the conditions of intended use and is a poor conductor of thermal energy such as, depending on the circumstances, foams (such as latex, stryofoam, polyurethane), glass wools, wood, plastics, rubbers, corks, glass, cotton and aerogels.

Heat transfer material block 22 is machined or molded to at least partially surround a contained vehicle fluid conduit. As shown in FIG. 1, a contained vehicle fluid conduit 32, having an inlet 34, an outlet 36, and exhibiting a serpentine path, is placed into a complimentary cavity within the heat transfer material block 22. The cavity may be of such dimensions so as to provide a compression fitting fastening the contained vehicle fluid conduit 32 to the heat transfer material block 22. Alternatively, the cavity may be of a type which simply provides a channel into which the contained vehicle fluid conduit 32 is positioned, thereafter being fastened by any chemical or mechanical technique which allows thermal communication between any contained vehicle fluid and the heat transfer material block 22.

Figure 2:
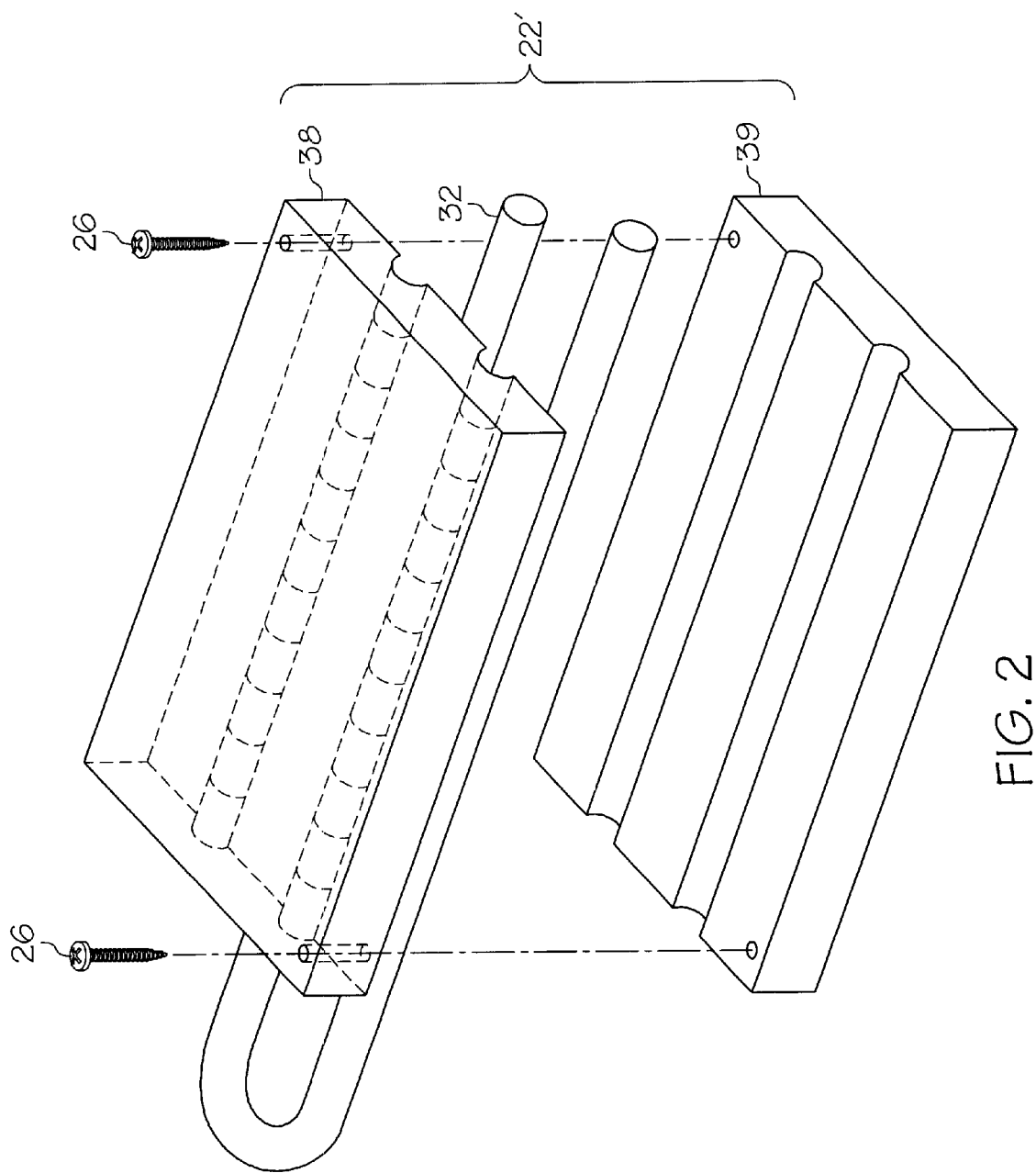
FIG. 2 is an exploded perspective view of a heat transfer portion of the first exemplary embodiment of the present invention.

As shown in FIG. 2, in circumstances where the cavity of the heat transfer material block 22' does not provide a compression fitting for the contained vehicle fluid conduit 32 or where it is desired to provide greater potential for thermal energy transfer with respect to the contained vehicle fluid, the heat transfer material block 22' may have mated upper and lower halves 38, 39. This upper half 38 is machined or molded to mate with the exterior dimensions of the contained vehicle fluid conduit 32 and the lower half 39, providing for encapsulation of a portion of the contained vehicle fluid conduit 32. Mounting the upper half 38 to the lower half 39 is accomplished with screws 26 in this exemplary embodiment, however, any chemical or mechanical technique, without limitation, such as epoxy resin, adhesive or compression fitting, may be utilized which supports thermal communication between the contained vehicle fluid conduit 32 and the upper half 38 as well as thermal communication between the upper half 38 and the lower half 39.

When activated the CWTD(s) 10 will cause a thermal gradient to be developed between the fluid in the vehicle fluid conduit 32 and the cooler wafer 12. As a result of this thermal gradient, heat will be transferred from the vehicle fluid through the heat transfer material block 22, through the cooler wafer 12 to the warmer wafer 14. This excess heat will, in turn, be transferred by the warmer wafer 14 to the heat sink 24, which will act to dissipate such excess heat. Such activation of the CWTD(s) 10 will thereby result in the cooling of the vehicle fluid, such as vehicle fuel, flowing through the vehicle fluid conduit 32 so long as the temperature of the vehicle fluid is above that of the surface temperature of the cooler wafer 12. It will also be apparent to those of ordinary skill that the polarity of the power to, or orientation of the CWTD(s) 10 may be reversed to provide a heating effect to the vehicle fluid so long as the temperature of the vehicle fluid is below that of the surface temperature of the warmer wafer.

Figure 3:
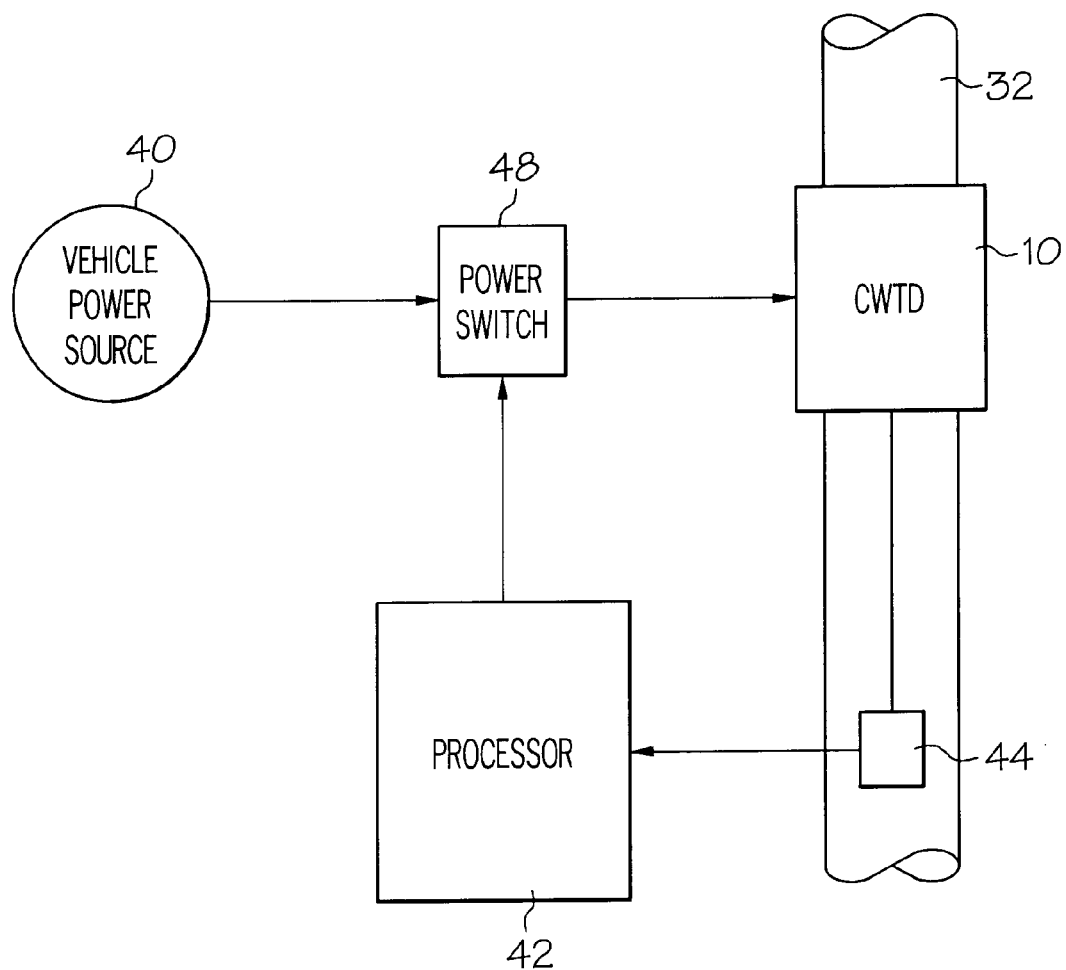
FIG. 3 is a schematic block diagram of an exemplary embodiment of the present invention.

As shown in FIG. 3, a control system may be provided to regulate the temperature of the fluid within the contained vehicle fluid conduit 32. The control system, which is readily available to those of ordinary skill in the art, includes a thermal energy detector 44; a power switch 48 operatively coupled between the vehicle power source 40 and the CWTD(s) 10 that is configured to couple the CWTD(s) 10 to the vehicle power source(s) 40 (i.e., activate the CWTD (s)) when activated and to decouple the CWTD(s) 10 from the vehicle power source(s) 40 (i.e., deactivate the CWTD (s)) when deactivated; and a processor 42 configured to control activation of the power switch 48 according to the readings received from the thermal energy detector 44 based upon a predetermined temperature control profile. As will be apparent to those of ordinary skill, the control system discussed above may be used with any of the vehicle fluid heating/cooling systems described or claimed herein. A manual switch may also be provided to allow a user to power the exchanger 11 when no control system is present, or to override the control system if necessary. The exchanger 11 may also be configured to receive continuous electrical power from a single vehicle power source 40, or to receive power from an alternate vehicle power source 40 should any one or more vehicle power sources 40 fail to provide the power necessary for the exchanger 11 to adequately operate. Vehicle power source 40 may be, for example, a stored energy source such as a battery, a vehicle source such as an alternator or a solar energy source. Those of ordinary skill will appreciate that many other types of power sources are available and are, thus, within the scope of the present invention.

The heat sink 24, the contained fluid conduit 32 and the heat transfer material block 22 may be either a homogeneous or heterogeneous material, or combination of materials, having heat transfer properties characterized by being a good conductor of thermal energy. In the exemplary embodiment, the heat sink 24 and the heat transfer material block 22 utilized are machined aluminum, while the contained vehicle fluid conduit 32 is copper tubing. As shown in FIG. 1, the heat sink 24 may be finned to allow a greater surface area to volume ratio in an attempt to maximize the potential for thermal energy dissipation as compared to a perfectly round object having no planar surfaces. It will be recognized by those of ordinary skill that other heat conductive materials and other heat sink designs than those shown could be utilized for, or in place of, the heat sink 24 to provide or improve upon the overall heat transfer without departing from the spirit and scope of the present invention.

Figure 4:
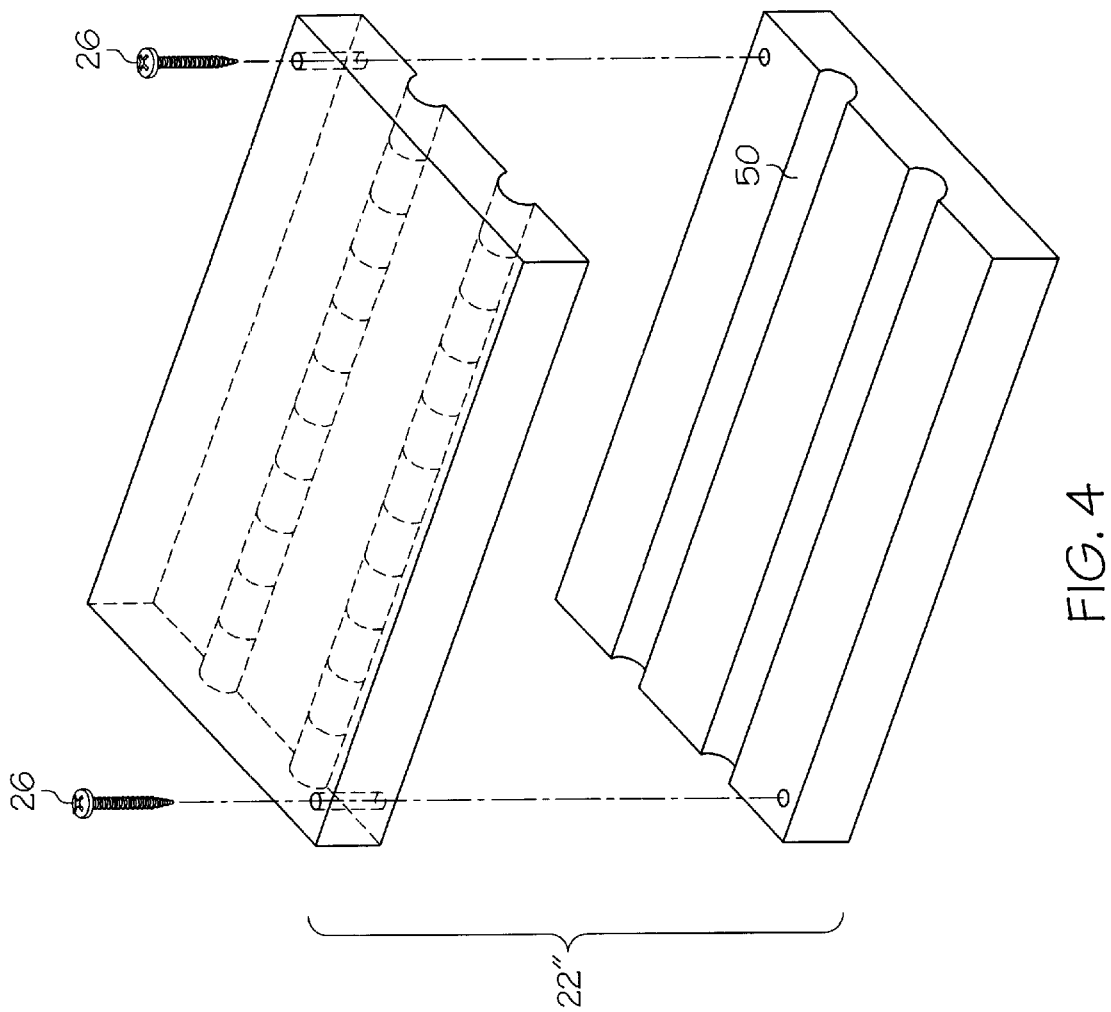
FIG. 4 is an exploded perspective view of an alternate heat transfer portion for use with the first exemplary embodiment of the present invention.

As shown in FIG. 4, another alternate construction of the heat transfer material block 22" may be seen where the heat transfer material block 22" is machined or molded to support contained vehicle fluid flow. The machined or molded patterns can be diverse and may include a plurality of substantially parallel channels 50 for contained vehicle fluid flow or a single channel having a serpentine path (not shown). Alternatively, the heat transfer material block 22" may be partitioned, machined and reassembled thereafter having one or more contained conduits for vehicle fluid flow. The heat transfer material block 22" may also be molded in multiple pieces and assembled. In assembling or reassembling the pieces of the heat transfer material block 22" there may be gaskets or other types of sealants or sealing devices included, thereby ensuring contained vehicle fluid flow.

Figure 5:
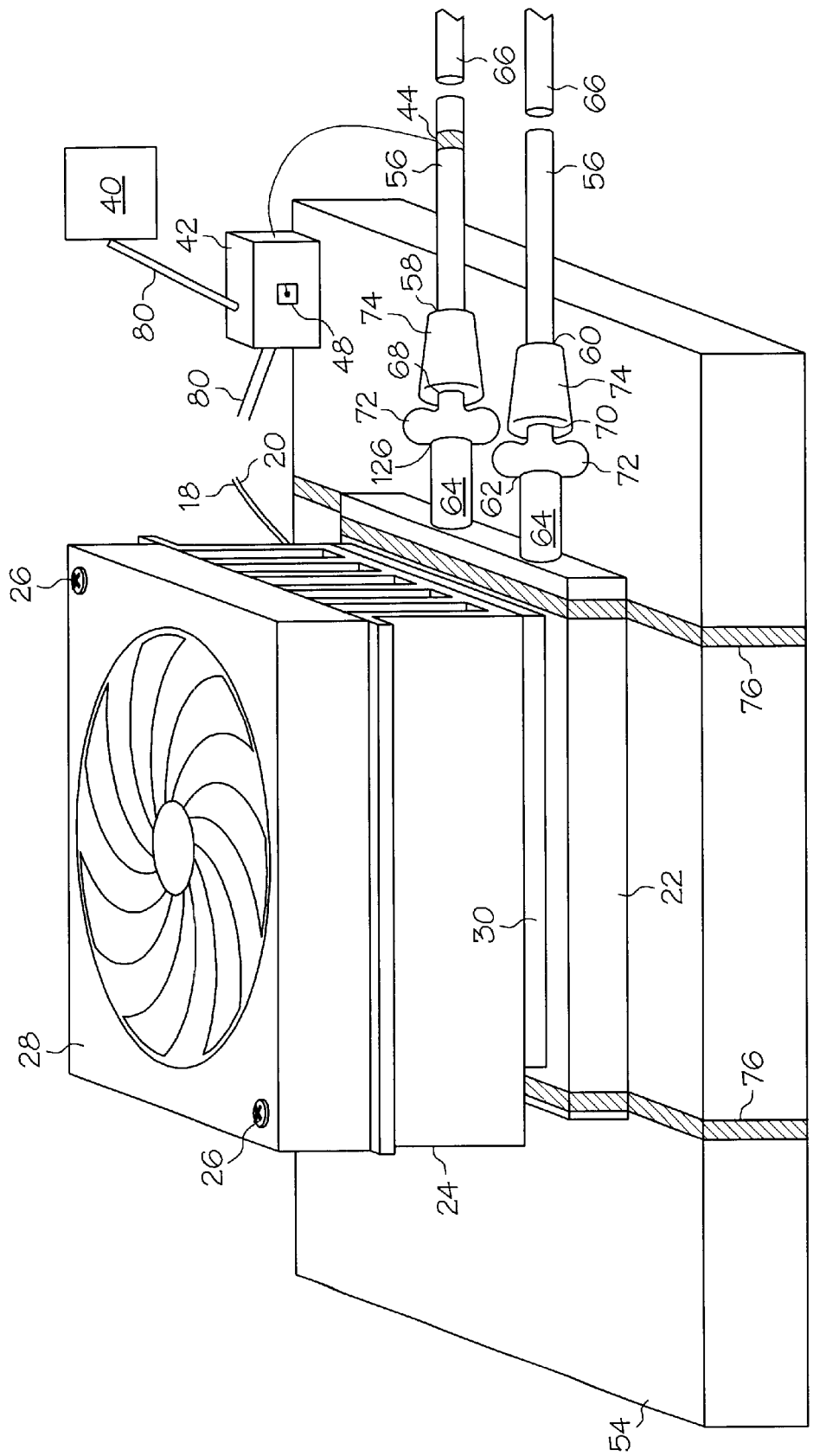
FIG. 5 is a perspective view of an exemplary mounting arrangement for the first embodiment of the present invention.

As shown in FIG. 5, the first exemplary embodiment of the vehicle fluid thermal energy exchanger 11 may be mounted or retrofit to a vehicle 54 body or frame as follows. The vehicle 54 is prepared by diverting at least a portion of the contained vehicle fluid flow, such that the existing contained vehicle fluid conduit 56 has an outlet 60 and an inlet 58. The outlet 60 of the existing contained vehicle fluid conduit 56 engages the inlet 62 of the contained vehicle fluid conduit 64, thus providing fluid communication between the conduits 56, 64. The outlet 126 of the contained vehicle fluid conduit 64 engages the inlet 58 of the existing contained vehicle fluid conduit 56, thus providing fluid communication and closing the vehicle fluid system 66. In other words, the sequence of fluid flow is: first, fluid exits the existing contained vehicle fluid conduit 56; second, fluid enters the contained vehicle fluid conduit 64 of the exchanger 11; third, fluid exits the contained vehicle fluid conduit 64 of the exchanger 11; and fourth, fluid enters the existing contained vehicle fluid conduit 56. The interfaces 68, 70 of the existing contained vehicle fluid conduit 56 and the contained vehicle fluid conduit 64 are closed by welding or any other technique, without limitation, which ensures a closed vehicle fluid system 66. Those of ordinary skill in the art are familiar with techniques for splicing and thereafter connecting conduits to contain fluid flow. An exemplary approach utilizes male and female connecting members 72, 74 which are respectively mounted to the existing contained vehicle fluid conduit's 56 and the contained vehicle fluid conduit's 64 inlets 58, 62 and outlets 60, 66. These mating members 72, 74 provide sealed connections between respective interfaces 68, 70 and may thereafter be disconnected by mechanical means. Brackets 76 are utilized to secure the exchanger to the vehicle 54 in this exemplary embodiment, however, any chemical or mechanical technique, without limitation, which secures the exchanger to the vehicle 54 is permissible. Vehicle power source connections 80 are also provided assuring adequate power supply from vehicle power source 40 to the loads of the exchanger 11. These connections 80 interface with the processor 42, the thermal energy detector 44 and the power switch 48 of the control system.

Figure 6:
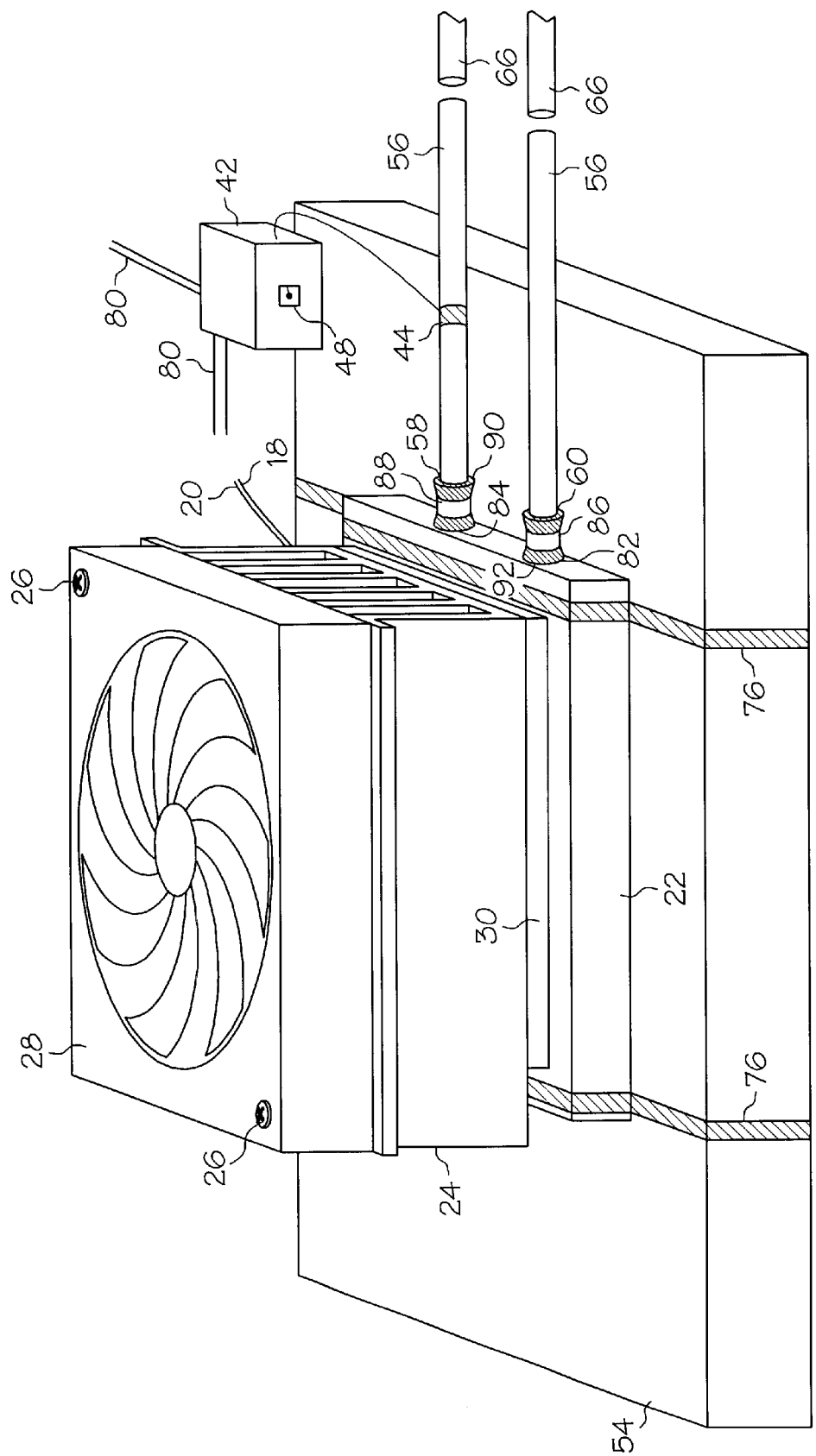
FIG. 6 is a perspective view of another exemplary mounting arrangement for the first exemplary embodiment of the present invention.

As shown in FIG. 6, an exchanger 11 utilizing the machined heat transfer material block 22" (FIG. 4) may be mounted or retrofit to a vehicle 54 body or frame as follows. The vehicle 54 is prepared by diverting at least a portion of the contained vehicle fluid flow, such that the existing contained vehicle fluid conduit 56 has an outlet 60 and an inlet 58. The outlet 60 of the existing contained vehicle fluid conduit 56 engages the inlet 82 of the contained vehicle fluid flow within the heat transfer material block 22", thus providing fluid communication between the existing vehicle fluid conduit 56 and the contained vehicle fluid flow within the heat transfer material block 22". The outlet 84 of the contained vehicle fluid flow within the heat transfer material block 22" engages the inlet 58 of the existing contained vehicle fluid conduit 56, thus providing fluid communication and closing the vehicle fluid system 66. In other words, the sequence of fluid flow is: first, fluid exits the existing contained vehicle fluid 56; second, fluid enters the heat transfer material block 22"; third, fluid exits the heat transfer material block 22"; and fourth, fluid enters the existing contained fluid conduit 56. The interfaces 86, 88 of the existing contained vehicle fluid conduit 56 and the contained vehicle fluid flow within the heat transfer material block 22" are closed by welding or any other technique, without limitation, which results in a closed vehicle fluid system 66. Those of ordinary skill in the art are familiar with the techniques for splicing and thereafter connecting conduits to contain fluid flow. An alternate approach utilizes male and female connecting members 90, 92 which are respectively mounted to the existing contained vehicle fluid conduit's inlet 58 and outlet 60 as well as the inlet 82 and outlet 84 of vehicle fluid flow within the heat transfer material block 22". These connecting members 90, 92 provide sealed connections between respective interfaces 86, 88 and may thereafter be disconnected by mechanical means. Brackets 76 are utilized to secure the exchanger to the vehicle 54 in this exemplary embodiment, but, any chemical or mechanical technique, without limitation, which secures the exchanger 11 to the vehicle 54 is permissible. Vehicle power source connections 80 are also provided assuring adequate power supply to the loads of the exchanger 11. These connections 80 interface with the processor 42, the thermal energy detector 44 and the power switch 48.

As will be apparent to those of ordinary skill, the heat transfer material block may be positioned in any manner such that thermal communication can occur between an existing contained vehicle fluid conduit and the heat transfer material block. The heat transfer material block may be machined or molded to better mate with the exterior geometries of the existing contained vehicle fluid conduit. It is not mandatory that the heat transfer material block be in physical contact with the existing contained vehicle fluid conduit, only that thermal communication between the two is provided.

It is within the scope and spirit of the present invention that the vehicle system of the first exemplary embodiment may for example, have intended uses including, without limitation, the heating of vehicle fluids such as fuels or lubricants. The vehicle system may be manufactured with, or retrofitted to a vehicle for the heating or pre-heating vehicle fuels such as diesel fuel, thereby providing fuel in transit to the combustion chamber having increased internal and/or thermal energy. Additionally, the vehicle system may be utilized to regulate the temperature of the fuel when the vehicle and fuel are exposed to environmental conditions tending to decrease the internal and/or thermal energy of the fuel. Also, the vehicle system may be manufactured with, or retrofitted to vehicles for the heating vehicle lubricants such as engine oils or transmission fluids, providing lubricants in transit to designated areas within the closed vehicle lubricant system having increased internal and/or thermal energy. Additionally, the vehicle system may be utilized to regulate the temperature of the lubricant when the lubricant and vehicle are exposed to environmental conditions tending to decrease the internal and/or thermal energy of the lubricant.

It is also within the scope and spirit of the present invention that the vehicle system of the first exemplary embodiment may for example, have intended uses including, without limitation, the cooling of vehicle fluids such as fuels, lubricants or coolants. When utilized in applications advantageous for the cooling of vehicle fuels such as gasoline or racing fuels, the vehicle system may be assembled with, or retrofitted to a vehicle thereby delivering fuel to the combustion chamber having decreased internal and/or thermal energy. Additionally, the vehicle system may be utilized to regulate the temperature of the fuel when exposed to environmental conditions tending to increase the internal and/or thermal energy of the fuel. The vehicle system may also be utilized in applications advantageous for the cooling of vehicle lubricants such as engine oils or transmission fluids. In this application, the vehicle system is assembled with, or retrofitted to a vehicle and thereafter provides lubricants in transit within the closed vehicle lubricant system having decreased internal and/or thermal energy. Also, the vehicle system may be utilized to regulate the temperature of the lubricant when the vehicle and lubricant are exposed to environmental conditions tending to increase the internal and/or thermal energy of the lubricant. The vehicle system may also be utilized in the cooling of vehicle coolants such as radiator fluid, air conditioning fluid and water. In these types of applications, the vehicle system is manufactured, or retrofitted to a vehicle such that coolant in transit within the closed vehicle cooling fluid system exhibits decreased internal and/or thermal energy. Additionally, the vehicle system may be utilized to regulate the temperature of the cooling fluids when the vehicle or fluids are exposed to environmental conditions tending to increase the internal and/or thermal energy of the radiator fluid.

Particularly, the vehicle system of the first exemplary embodiment may be assembled with, or retrofitted to racing vehicles utilizing racing fuels. The vehicle system provides a gradient through which excess internal and/or thermal energy from the racing fuel may escape. As the fuel is cooled, the density of the fuel is increased providing for an increased amount of fuel per unit volume to enter the combustion chamber. When combusted, the increased amount of fuel produces an increased amount of gaseous byproducts resulting in increased power exhibited by the racing vehicle's engine.

It will be understood by those of ordinary skill that many of the aforementioned applications and vehicle systems have been described as being retrofit or retrofitted, however, it is within the scope and spirit of the present invention that the systems and applications described above may be incorporated into the production of a new vehicle.

Figure 7:
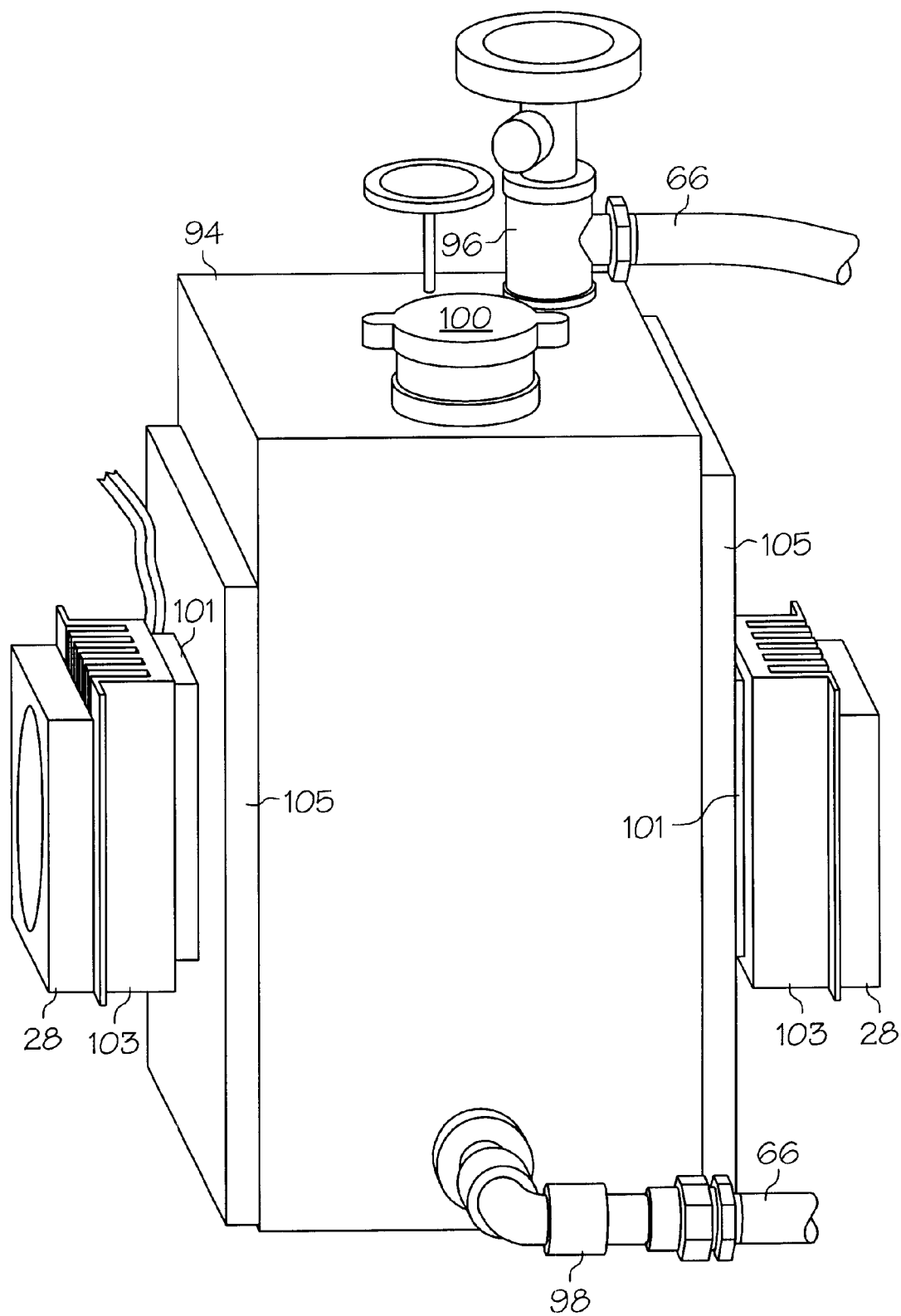
FIG. 7 is a perspective view of a second exemplary embodiment of the present invention.
Figure 8:
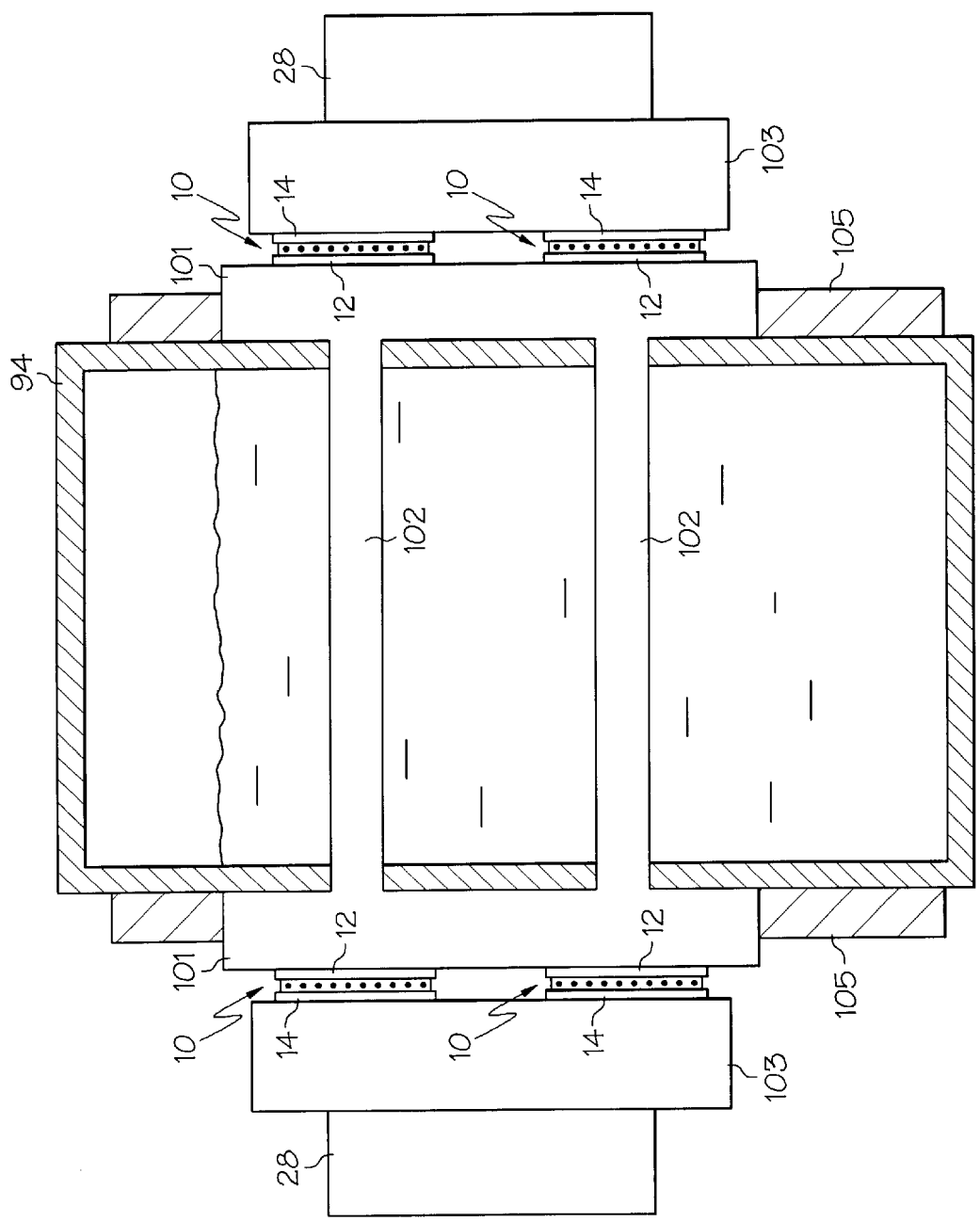
FIG. 8 is a cross-sectional, elevational view of the second exemplary embodiment of the present invention.

As shown by FIGS. 7 and 8, a second exemplary embodiment of the vehicle fluid thermal energy transfer system is used with a vehicle fluid reservoir, such as a lubrication sump. A vehicle fluid reservoir 94 for containing vehicle fluids such as fuels, lubricants and coolant fluids includes an inlet 96 and an outlet 98 in fluid communication with a closed vehicle fluid system 66. The vehicle fluid reservoir 94 also includes an opening 100 which may be resealed for adding additional fluid to the vehicle fluid reservoir 94. The thermal energy transfer system includes a pair of heat transfer material blocks 101 that are mounted on opposite sides of the vehicle fluid reservoir 94 and connected to each other by a heat transfer rod 102 (See FIG. 8) that extends through the vehicle fluid reservoir 94 and into the fluid contained therein. A series of CWTD(s) 10 (See FIG. 8) are positioned against the heat transfer material blocks 101 such that the cooler wafers 12 are in thermal communication with the pair of heat transfer material blocks 101 and associated heat transfer rod(s) 102. A pair of heat sinks 103, having a plurality of heat dissipating fins, are mounted to the CWTD(s) 10 so as to provide thermal communication between the warmer wafers 14 and the heat sinks 103 (See FIG. 8). Additionally, a fan 28 is mounted to each of the pair of heat sinks 103, to provide induced air currents traveling over the pair of heat sinks 103, thereby helping to dissipate heat from the heat sinks 103.

When activated the CWTD(s) 10 will cause a induced thermal gradient to be developed between the fluid in the vehicle fluid reservoir 94 and the cooler wafers 12. The induced thermal gradient provides a driving force for heat transfer to the cooler wafers 12 so long as the temperature of the vehicle fluid within the reservoir is greater than the temperature of the cooler wafers 12. As a result of this induced thermal gradient, heat will be transferred from the vehicle fluid, through the vehicle fluid reservoir 94 and/or the heat transfer rod(s) 102, through the pair of heat transfer material blocks 101 and through the cooler wafer 12 to the warmer wafer 14. This excess heat will, in turn, be transferred from the warmer wafers 14 to the pair of heat sink 103, which will act as dissipater of heat. Thus, activation of the CWTD(s) 10 will thereby result in the cooling of the vehicle fluid, such as a vehicle lubricant within the vehicle fluid reservoir 94. Additionally, a control system as described above with respect to FIG. 3 may be provided to regulate the temperature of the vehicle fluid within the vehicle fluid reservoir 94.

Optionally, insulation 105 may be utilized to insulate the exposed portions of the semiconductor blocks 16, portions of the heat transfer material blocks 101 and the vehicle fluid reservoir 94. The insulation 105 may be any type of insulation which withstands the conditions of intended use and is a poor conductor of thermal energy such as, depending on the circumstances, foams (such as latex, stryofoam, polyurethane), glass wools, wood, plastics, rubbers, corks, glass, cotton and aerogels.

Figure 9:
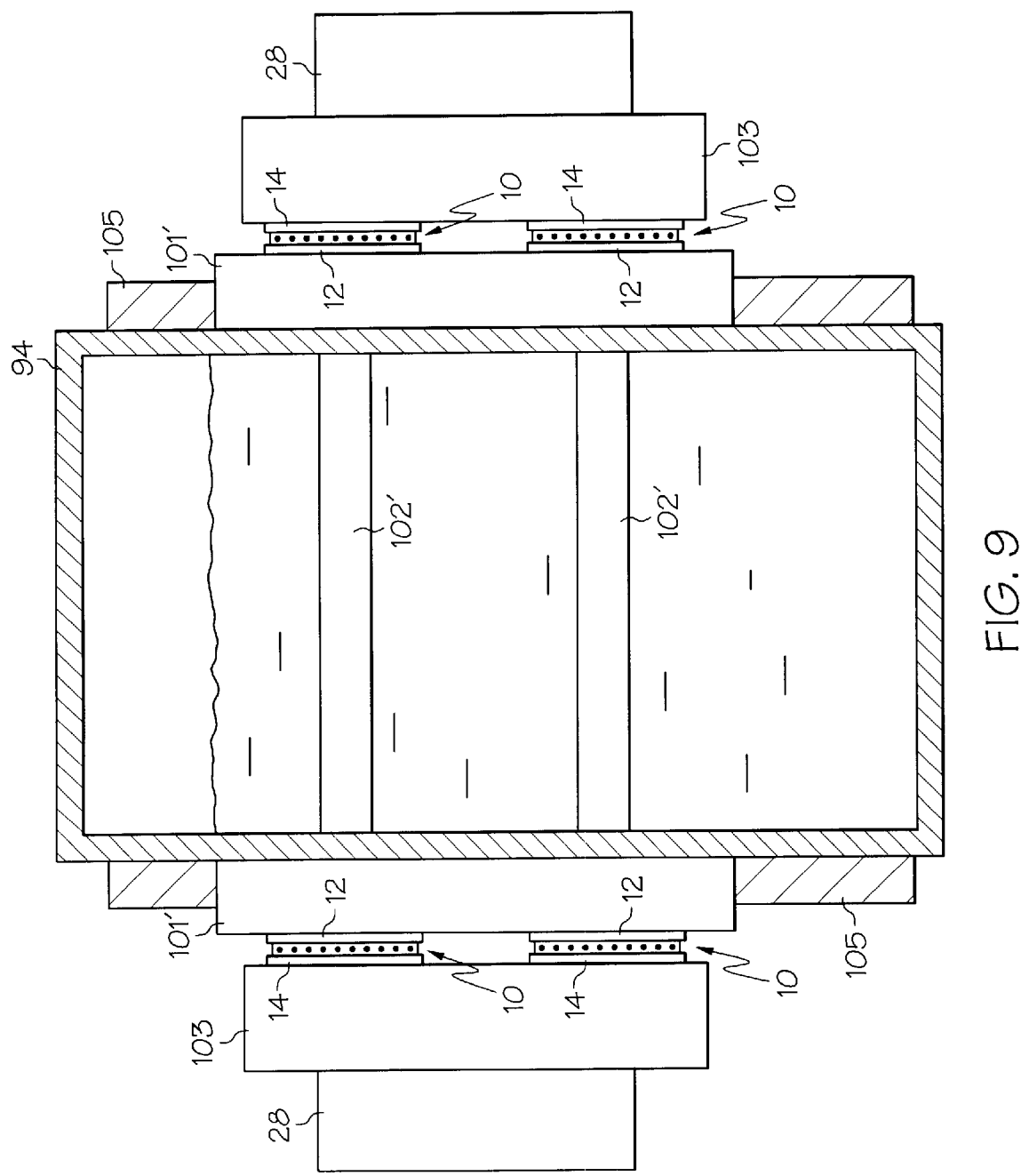
FIG. 9 is a cross-sectional, elevational view of an alternate arrangement of the second exemplary embodiment of the present invention.

As shown in FIG. 9, an alternate arrangement for the second exemplary embodiment utilizes at least one heat transfer rod 102' that extends inwardly from the walls of the reservoir 94 itself, rather than from the heat transfer material blocks 101' as in the arrangement shown in FIGS. 7 and 8. This arrangement works best when the reservoir 94 is made from a suitable heat transfer material (such as aluminum) so that heat can travel from the rods 102' through the walls of the reservoir 94 to the heat transfer material blocks 101'.

It will be understood by those of ordinary skill in the art that the heat transfer rods of FIGS. 7–9 illustrate exemplary projections of heat transfer material extending into the reservoir to assist in the heat transfer between the vehicle fluid in the reservoir and the CWTD(s); and that many alternate designs, sizes and arrangements of projections will fall within certain aspects of the present invention. It will also be understood by those of ordinary skill that it is not necessary to utilize rods or any alternate projection extending in the reservoir in order to fall within the scope of the invention, since it is possible for sufficient heat transfer to occur through the walls of the reservoir to the heat transfer material blocks and, subsequently, to the CWTD(s). It is also possible that the heat transfer material blocks themselves extend through the walls of the reservoir to be in contact with the contents of the reservoir.

It is to be understood that with the embodiments shown in FIGS. 7–9, it is not necessary that any, or the entire surface of the cooler wafers 12 be in direct contact with the heat transfer material blocks 101, 101', nor that the warmer wafers 14 be in direct contact with the heat sinks 103, so long as thermal communication is preserved. The CWTD(s) 10 may be secured to the heat transfer material blocks 101, 101' and the heat sinks 103 by any chemical or mechanical technique, without limitation, such as epoxy resin or compression fittings which allows for thermal communication between the heat transfer material blocks 101, 101' and the heat sinks 103 and their respective cooler and warmer wafers 12, 14 of the CWTD(s) 10. Additionally, a fan 28 is mounted to each heat sink 103, which provides induced fluid currents over the heat sinks 103.

It is within the scope and spirit of the present invention that the vehicle system of the second exemplary embodiment may for example, have intended uses including, without limitation, the heating of vehicle lubricants or fuels. When utilized in applications advantageous for the heating of vehicle fuels such as diesel fuels, the vehicle system may be assembled with, or retrofitted to a vehicle providing fuel at a point of accumulation having increased internal and/or thermal energy. Additionally, the vehicle system may simply be utilized to regulate the temperature of the vehicle fuel when the fuel and/or vehicle is exposed to environmental conditions tending to decrease the internal and/or thermal energy of the vehicle fuel. The second exemplary embodiment may also be utilized in applications advantageous for the heating of vehicle lubricants such as engine oils or transmission fluids. The vehicle system may be assembled with, or retrofitted to a vehicle providing lubricants at a point of accumulation within the closed vehicle lubricant system having increased internal and/or thermal energy. Additionally, the vehicle system may be utilized to regulate the temperature of the lubricant when the vehicle and/or lubricant is exposed to environmental conditions tending to decrease the internal and/or thermal energy of the lubricant.

Particularly, the vehicle system of the second exemplary embodiment may be assembled with, or retrofitted to a vehicle providing low viscosity vehicle lubricants at engine or transmission start-up. The vehicle system may also be utilized in "prelube" applications. Generally, prior to engine start-up, neither the engine nor transmission are lubricated. Only after the engine is started is power provided to lubricant pumps such as oil and transmission pumps. The very reason for a lubricant is to reduce degradation of engine components from friction. In this particular application, the vehicle lubricant is heated by the vehicle system of the second exemplary embodiment and pumped throughout the closed vehicle fluid system providing for a "prelube" of the vital engine and transmission components. In this way, the engine and transmission are lubricated before friction occurs, thereby reducing the wear of the components at start-up as compared to no or very little lubrication at all.

It is also within the scope and spirit of the present invention that the vehicle system of the second exemplary embodiment may for example, have intended uses including, without limitation, the cooling of vehicle fluids such as fuels, lubricants or coolants. When utilized in applications advantageous for the cooling of vehicle fuels such as gasoline or racing fuels, the vehicle system may be assembled with, or retrofitted to a vehicle providing fuel at a point of accumulation having decreased internal and/or thermal energy. Additionally, the vehicle system may simply be utilized to regulate the temperature of the fuel when the vehicle and/or fuel is exposed to environmental conditions tending to increase the internal and/or thermal energy of the fuel. When utilized in applications advantageous for the cooling of vehicle lubricants such as engine oils or transmission fluids, the vehicle system may be assembled with, or retrofitted to a vehicle providing lubricants at a point of accumulation within the closed vehicle lubricant system having increased internal and/or thermal energy. Additionally, the vehicle system may be utilized to regulate the temperature of the lubricant when the vehicle and/or lubricant is exposed to environmental conditions tending to increase the internal and/or thermal energy of the lubricant. Also, the second exemplary embodiment could be utilized in applications advantageous for the cooling of vehicle coolants such as radiator fluid, air conditioning fluid or water. The vehicle system may be assembled with, or retrofitted to a vehicle, thereby providing cooling fluids at a point of accumulation within the closed vehicle cooling fluid system having decreased internal and/or thermal energy. In addition, the vehicle system may be utilized to regulate the temperature of the cooling fluids when the vehicle and/or coolant is exposed to environmental conditions tending to increase the internal and/or thermal energy of the vehicle coolant.

Particularly, the vehicle system of the second exemplary embodiment may be assembled with, or retrofitted to racing vehicles utilizing vehicle lubricants such as engine oils and transmission fluids. The vehicle system provides a gradient through which excess internal and/or thermal energy from the lubricants can escape. As the lubricant is cooled, the density of the lubricant is increased providing for an increased amount of lubricant per unit volume. This increased density exhibited by the lubricant generally provides for higher viscosity and resistance to movement. As documented in the area of racing, when vehicle fluids, particularly vehicle lubricants have lower viscosities, they tend to slosh within the accumulation vessel. This movement within the vessel reduces the available energy produced by the engine which may move the vehicle in the particular direction advantageous to racing.

While the aforementioned embodiments have been specific, other embodiments and modifications are intended to be covered by the spirit and scope of applicant's disclosure.

Figure 10:
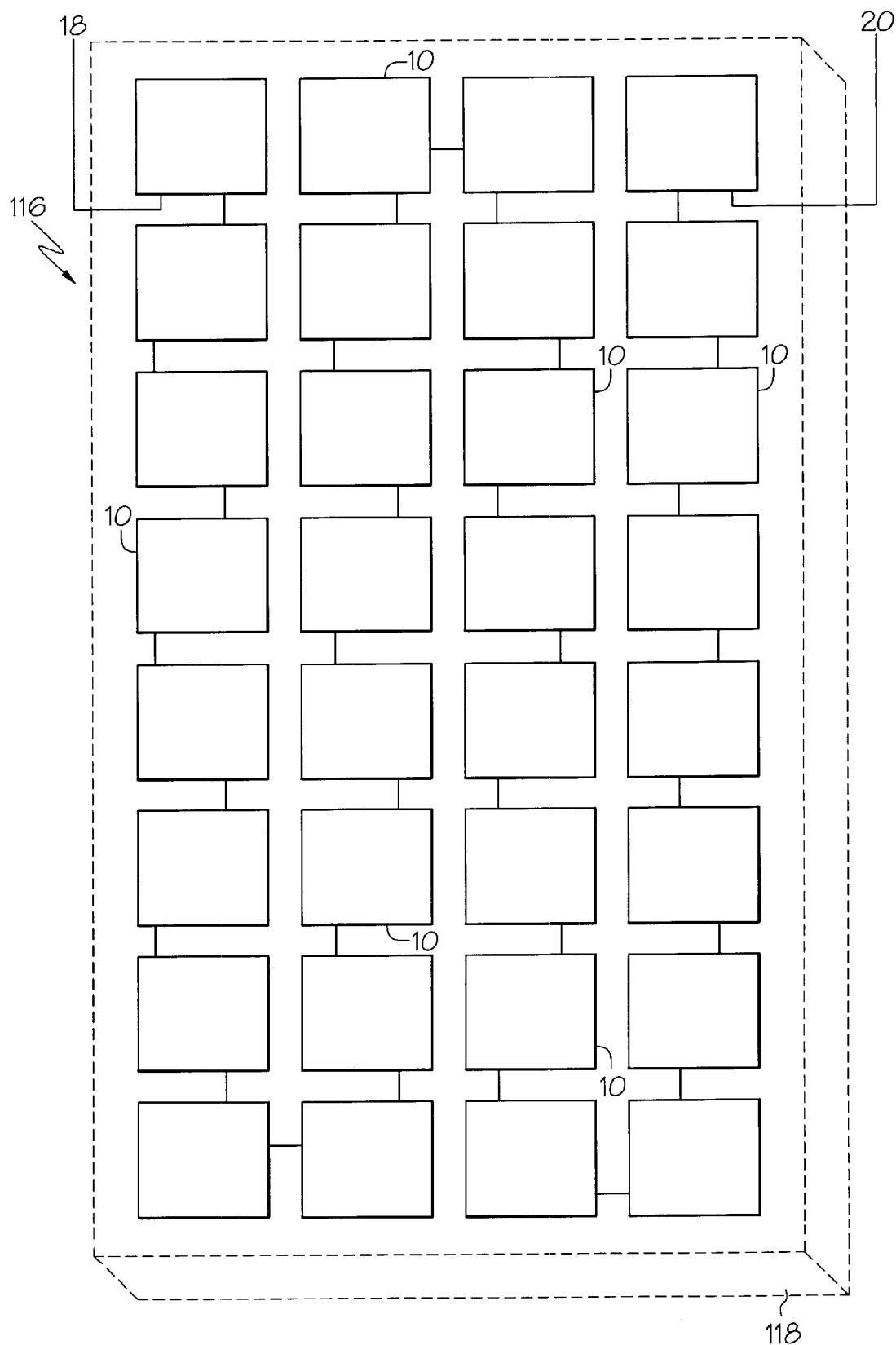
FIG. 10 is a schematic representation of an arrangement of thermoelectric devices that may be used with one or more exemplary embodiments of the present invention.

Referencing FIG. 10, the CWTD(s) 10 utilized in each of the exemplary embodiments may be used separately, or in conjunction with a plurality of CWTD(s) 10 to form a "bank" 116 of cooling or heating potential. The CWTD(s) 10 are powered by direct electric current and may be connected in series or parallel. In an exemplary embodiment, the CWTD(s) 10 are connected in series, driven by a 12-volt DC power source, forming a "bank" 116, thereby increasing the theoretical maximum amount of heat transferable as opposed to a single CWTD 10. Generally, the banks 116 are connected so as to provide 100% of their cooling or heating capability to the exclusion of the other. In other words, the bank is electrically configured so as to only receive direct current in one direction and have all warmer surfaces facing one way, and all cooler surfaces facing the other. However, the present invention contemplates a more complex arrangement of a bank 116.

In this example, two possibilities exist for powering the organized bank 116: First, providing current in the "J" direction, thereby reducing the thermal energy of the target 118; or, second, providing current in the "–J" direction, thereby increasing the thermal energy of the target 118. This configuration may be substituted into each of the exemplary embodiments which are configured so as to have current which travels in the "J" or "–J" directions. This organizational structure may be used in any of the exemplary embodiments whenever a device is in place capable of switching the direction of current depending on whether the target 118 is in need of thermal energy or has excess thermal energy needing to be drawn away.

Figure 11:
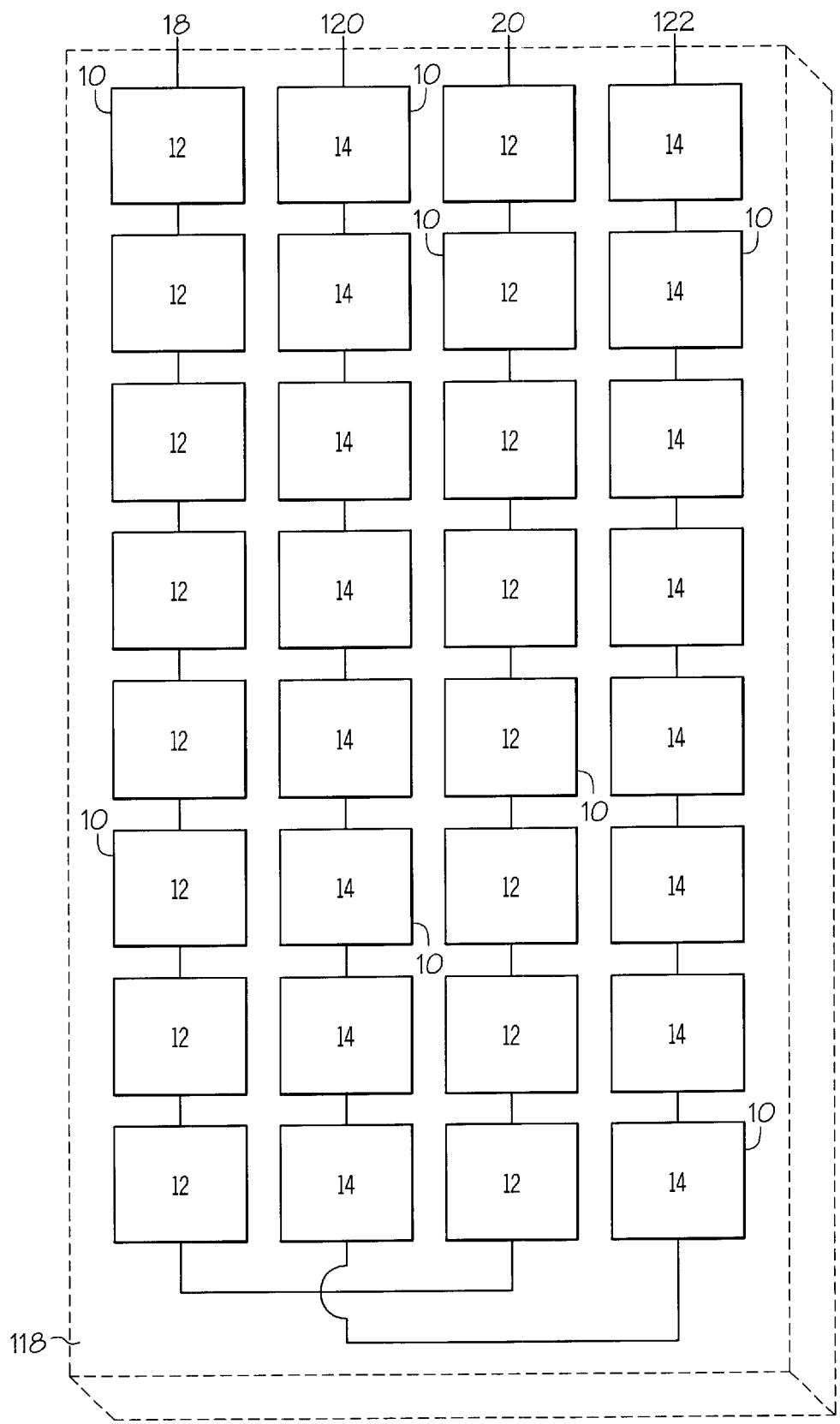
FIG. 11 is a schematic representation of an other arrangement of thermoelectric devices that may be used with one or more exemplary embodiments of the present invention.

Referring FIG. 11, is can be seen that the bank of CWTD(s) 10 are in an organized pattern of alternating cooler and warmer wafers 12, 14 in a single direction. The circuitry is such that the CWTD(s) 10 are connected so that all cooler wafers 12 which absorb thermal energy are electrically connected in series via leads 18, 20, while all warmer wafers 14 which dissipate thermal energy are electrically connected in series via another set of leads 120, 122. The surfaces of the wafers 12, 14 of the CWTD(s) 10 facing the target 118 are in thermal communication with the target 118. In this configuration three possibilities exist for powering the organized circuitry: First—provide power to each series of leads 18, 20 and 120, 122(heating and cooling series), thereby having a minimal amount of net thermal energy change exhibited by the target; Second—providing power to only those CWTD(s) 10 which are part of the cooling series, via leads 18, 20(wafers 12), thereby reducing the thermal energy of the target; or Third—providing power only to those CWTD(s) 10 which are part of the heating series, via leads 120, 122 (wafers 14), thereby increasing the thermal energy of the target. The first arrangement heats and cools simultaneously, thus net effective cooling or heating is not realized. In the second and third arrangement, the bank 116 is not taking full advantage of the potential thermal energy transfer; only half of the wafers are powered at any one time. This arrangement is advantageous in that heating and cooling may be accomplished even if no device is present to invert the direction of the electric current.

For simplification purposes, a majority of the exemplary embodiments have been explained in terms of cooling a vehicle fluid. However, one of ordinary skill in the art will readily appreciate that all of the exemplary embodiments could function in a heating capacity for increasing the internal energy of vehicle fluids by either flipping the orientation of the wafer surfaces and maintaining the direction of current flow, by switching the direction of current flow and maintaining the orientation of the wafer surfaces, or by having an alternating bank of hot/cold wafers such that the hot wafers are powered to the exclusion of the cold wafers and vice versa.

As a caveat to the heat transfer materials discussed above, it will be well understood by those skilled in the art that aluminum has a relatively high thermal conductivity (117 Btu/h·ft·° F. at 32° F.)) as compared to other metals such as mild steel (26 Btu/h·ft·° F. at 32° F.) and cast iron (30 Btu/h·ft·° F. at 68° F.). While aluminum's higher thermal conductivity makes it more advantageous to use as a material through which heat or thermal energy will travel, other materials could certainly be used such as cast iron, copper (224 Btu/h·ft·° F. at 32° F.), or more expensive materials such gold (169 Btu/h·ft·° F. at 68° F.) and silver (242 Btu/h·ft·° F. at 32° F.). For the purposes of this invention, therefore, a heat transfer material includes any material (metallic or non-metallic) having a suitable thermal conductivity for allowing heat transfer between the CWTD(s) and the vehicle fluid as well as between the CWTD(s) and a heat sink. While aluminum is called for in the exemplary embodiments, it will be appreciated that materials with lower or higher thermal conductivity may be suitable "heat transfer materials" for a given application.

What is claimed is:

1. A vehicle system for transferring thermal energy in relation to a vehicle fluid comprising:
    at least one thermoelectric device, having at least two surfaces, concurrently dissipating thermal energy on a warmer surface and absorbing thermal energy on a cooler surface, mounted to a vehicle and in proximity to a contained vehicle fluid, and providing thermal communication between the contained vehicle fluid and at least one of the warmer and cooler surfaces of the thermoelectric device, wherein the contained vehicle fluid is contained in a vehicle fluid conduit, and the vehicle system is mounted such that the cooler surface of the thermoelectric device is in thermal communication with the vehicle fluid conduit; and
    a first heat transfer material block mounted to a vehicle and positioned between the contained vehicle fluid and the cooler surface of the thermoelectric device, such that the cooler surface of the thermoelectric device and the first heat transfer material block are in thermal communication, and such that the first heat transfer material block and the contained vehicle fluid are in thermal communication, wherein the first heat transfer material block includes the vehicle fluid conduit extending therethrough for contained vehicle fluid flow.

2. The vehicle system of claim 1, wherein a vehicle fluid source feeds the contained vehicle fluid into the vehicle fluid conduit.

3. The vehicle system of claim 2, wherein the vehicle fluid conduit is separate from the first heat transfer material block.

4. The vehicle system of claim 2, wherein the vehicle fluid conduit includes a series of substantially parallel channels extending through the first block of heat transfer material block.

5. The vehicle system of claim 1, wherein the vehicle fluid conduit includes at least one channel.

6. The vehicle system of claim 5, wherein the channel runs in a serpentine path.

7. A vehicle system for transferring thermal energy in relation to a vehicle fluid comprising at least one thermoelectric device, having at least two surfaces, concurrently dissipating thermal energy on a warmer surface and absorbing thermal energy on a cooler surface, mounted to a vehicle and in proximity to a contained vehicle fluid, and providing thermal communication between the contained vehicle fluid and the warmer surface of the thermoelectric device, wherein the thermoelectric device is configured to operate off of a vehicle power source, wherein the cooler surface is in contact with the ambient environment 8. A vehicle system for transferring thermal energy in relation to a vehicle fluid comprising:
    at least one thermoelectric device, having at least two surfaces, concurrently dissipating thermal energy on a warmer surface and absorbing thermal energy on a cooler surface, mounted to a vehicle and in proximity to a contained vehicle fluid, and providing thermal communication between the contained vehicle fluid and the warmer surface of the thermoelectric device, wherein the thermoelectric device is configured to operate off of a vehicle power source and wherein the contained vehicle fluid is contained within at least the one of a vehicle fluid reservoir and a vehicle fluid conduit; and
    a first heat transfer material block mounted to a vehicle and including a vehicle fluid conduit extending therethrough for the contained vehicle fluid to flow.

9. The vehicle system of claim 8, wherein the vehicle fluid conduit is separate from the first heat transfer material block.

10. The vehicle system of claim 8, wherein the vehicle fluid conduit includes a series of substantially parallel channels extending therethrough.

11. The vehicle system of claim 8, wherein the vehicle fluid conduit includes at least one channel.

12. The vehicle system of claim 11, wherein the channel runs in a serpentine path.

13. A vehicle system for transferring thermal energy in relation to a vehicle fluid comprising at least one thermoelectric device, having at least two surfaces, concurrently dissipating thermal energy on a warmer surface and absorbing thermal energy on a cooler surface, mounted to a vehicle and in proximity to a contained vehicle fluid, and providing thermal communication between the contained vehicle fluid and the cooler surface of the thermoelectric device, wherein the thermoelectric device is configured to operate off of a vehicle power source and wherein the warmer surface is in contact with the ambient environment.

14. An apparatus adapted-to-be mated with a vehicle fluid system comprising:
   a) a first heat transfer material block adapted to be mounted to a vehicle and in thermal communication with a contained vehicle fluid, wherein the first heat transfer material block contains a conduit extending therethrough for contained vehicle fluid flow which is adapted to be mated with a closed vehicle fluid system and providing fluid communication therewith;
   b) a heat sink; and
   c) at least one thermoelectric device, having at least a first and second surface, such that the first surface is in thermal communication with the first heat transfer material block and the second surface is in thermal communication with the heat sink.

15. An apparatus mated with a vehicle fluid system comprising:
   a) a first heat transfer material block adapted to be mounted to a vehicle and in thermal communication with a contained vehicle fluid,
   b) a heat sink;
   c) at least one thermoelectric device, having at least a first and second surface, such that the first surface is in thermal communication with the first heat transfer material block and the second surface is in thermal communication with the heat sink; and
   d) an electric fan being mounted to the heat sink.

16. The apparatus of claim 15, wherein the electric fan and the thermoelectric device are adapted to be powered from a vehicle power source.

17. A method of retrofitting a vehicle with a vehicle fluid cooling system comprising the steps of:
   a) mounting a vehicle fluid cooling system for transferring thermal energy in relation to a closed vehicle fluid system, the vehicle fluid cooling system including at least one thermoelectric device having at least two surfaces, concurrently absorbing thermal energy on a first surface and dissipating thermal energy on a second surface;
   b) configuring the thermoelectric device to receive power from at least one source, wherein the source is at least one of a vehicle source, a stored energy source and a solar energy source;
   c) connecting the vehicle fluid cooling system to be in fluid communication with a vehicle fluid of the closed vehicle fluid system;
   d) diverting of at least a portion of the vehicle fluid within the closed vehicle fluid system; and
   e) containing a majority of the vehicle fluid diverted within the vehicle fluid cooling system, at least temporarily, for subsequent delivery back to the closed vehicle fluid system.

18. The method of claim 17, wherein the step of diverting at least a portion of the vehicle fluid includes the step of diverting the vehicle fluid through a heat transfer material block in thermal communication with the first surface of the thermoelectric device and having a conduit extending therethrough for diverted flow.

19. The method of claim 18, wherein the conduit runs in a serpentine path.

20. The method of claim 18, wherein the conduit includes a plurality of substantially parallel channels.

21. The method of claim 18, wherein the conduit is a single channel.

22. A vehicle fuel cooling system comprising:
   a) a heat sink;
   b) a first heat transfer material block mounted to a vehicle and having a fuel path extending therethrough; and
   c) at least one thermoelectric device, having a cooling wafer and a heating wafer, sandwiched between the first heat transfer material block and the heat sink such that the cooling wafer contacts the first heat transfer material block and such that the heating wafer contacts the heat sink.

23. A vehicle fuel cooling system comprising:
   a) a first heat transfer material block mounted to a vehicle and hating a fuel conduit extending therethrough;
   b) a finned heat transfer material block;
   c) at least one thermoelectric device, having a cooling surface and an opposed heating surface, being sandwiched between the first heat transfer material block and the finned heat transfer material block such that the cooling surface faces the fist heat transfer material block and such that the opposed heating surface faces the first heat transfer material block; and
   d) a power source to supply electricity to the thermoelectric device.

24. The vehicle fuel cooling system of claim 23, further comprising an electric fan adapted to direct airflow over the finned heat transfer material block.

25. The vehicle fuel cooling system of claim 23, further comprising a fuel pipe of heat transfer material extending through the conduit.

26. A vehicle fuel heating system comprising:
   a) a heat sink;
   b) a first heat transfer material block mounted to a vehicle and having a fuel path extending therethrough; and
   c) at least one thermoelectric device, having a cooling wafer and a heating wafer, sandwiched between the first heat transfer material block and the heat sink such that the heating wafer contacts the first heat transfer material block and such tat the cooling wafer contacts the heat sink.

27. A vehicle fuel heating system comprising:
   a) a first heat transfer material block mounted to a vehicle and having a fuel conduit extending therethrough;
   b) a finned heat transfer material block;
   c) at least one thermoelectric device, having a cooling surface and an opposed heating surface, being sandwiched between the first heat transfer material block and the finned heat transfer material block such that the heating surface faces the first heat transfer material block and such that the cooling surface faces the finned heat transfer material block; and
   d) a power source to supply electricity to the thermoelectric device.

28. The vehicle fuel heating system of claim 27, further comprising an electric fan adapted to direct airflow over the finned heat transfer material block.

29. The vehicle fuel heating system of claim 27, further comprising a fuel pipe of heat transfer material extending through a fuel conduit.

30. A method of cooling a vehicle lubricant comprising steps of:
  a) providing at least one thermoelectric device having at least a cooler surface and a warmer surface opposing the cooler surface;
  b) mounting the thermoelectric device to a vehicle;
  c) utilizing the thermoelectric device to develop a gradient between a vehicle lubricant and the cooler surface of the thermoelectric device; and
  d) supplying forced convection to increase heat dissipation from the warmer surface.

31. A method of heating a vehicle lubricant comprising the steps of:
  a) providing at least one thermoelectric device having at least a cooler surface and a warmer surface opposing the cooler surface;
  b) mounting the thermoelectric device to a vehicle; and
  c) utilizing the thermoelectric device to develop a gradient between a vehicle lubricant and the warmer surface of the thermoelectric device.

32. The method of claim 31, further comprising the steps of:
  d) transferring heat to the vehicle lubricant from the warmer surface of the thermoelectric device; and
  e) transferring heat within the thermoelectric device from the cooler surface to the warmer surface.

33. The method of claim 31, further comprising the step of:
  d) supplying forced convection to increase heat transfer to the cooler surface.

* * * * *

UNITED STATES PATENT AND TRADEMARK OFFICE
CERTIFICATE OF CORRECTION

PATENT NO.     : 6,502,405 B1
DATED          : January 7, 2003
INVENTOR(S)    : Van Winkle It is certified that error appears in the above-identified patent and that said Letters Patent is hereby corrected as shown below:

Column 17,
Lines 7-8, pursuant to Examiner's amendment of October 7, 2002, the phrase "adapted to be" should be deleted from between the words "block" and "mounted" or -- block mounted --
Lines 12-13, pursuant to Examiner's amendment of October 7, 2002, the phrase "adapted to be" should be deleted from between the words "is" and "mated" or -- is mated --

Column 18,
Line 23, the word "hating" between the words "and" and "a fuel" should be deleted and replaced with the word "having" or -- and having a fuel --
Line 30, the word "fist" between the words "the" and "heat" should be deleted and replaced with the word "first" or -- the first heat --
Line 32, the word "first" between the words "the" and "heat" should be deleted and replaced with the word "finned" or -- the finned heat --
Line 51, the word "tat" between the words "such" and "the" should be deleted and replaced with the word "that" or -- such that the --

Signed and Sealed this

Twenty-ninth Day of July, 2003

JAMES E. ROGAN
*Director of the United States Patent and Trademark Office*